(12) United States Patent
Namba et al.

(10) Patent No.: US 9,048,184 B2
(45) Date of Patent: Jun. 2, 2015

(54) METHOD OF FORMING A GATE CONTACT

(71) Applicants: Carol O. Namba, Walnut, CA (US);
Po-Hsin Liu, Anaheim, CA (US);
Sumiko Poust, Hawthorne, CA (US);
Ioulia Smorchkova, Lakewood, CA (US);
Michael Wojtowicz, Long Beach, CA (US);
Ronald Grundbacher, Oberrieden (CH)

(72) Inventors: Carol O. Namba, Walnut, CA (US);
Po-Hsin Liu, Anaheim, CA (US);
Sumiko Poust, Hawthorne, CA (US);
Ioulia Smorchkova, Lakewood, CA (US);
Michael Wojtowicz, Long Beach, CA (US);
Ronald Grundbacher, Oberrieden (CH)

(73) Assignee: Northrop Grumman Systems Corporation, Falls Church, VA (US)

( * ) Notice: Subject to any disclaimer, the term of this patent is extended or adjusted under 35 U.S.C. 154(b) by 138 days.

(21) Appl. No.: 13/837,856

(22) Filed: Mar. 15, 2013

(65) Prior Publication Data

US 2014/0264448 A1 Sep. 18, 2014

(51) Int. Cl.
*H01L 21/28* (2006.01)
*H01L 29/778* (2006.01)
*H01L 29/66* (2006.01)
*H01L 21/285* (2006.01)
*H01L 21/027* (2006.01)
*H01L 29/78* (2006.01)
*H01L 29/423* (2006.01)
*H01L 29/20* (2006.01)

(52) U.S. Cl.
CPC ........ *H01L 21/28114* (2013.01); *H01L 29/778* (2013.01); *H01L 29/66431* (2013.01); *H01L 21/28537* (2013.01); *H01L 29/66462* (2013.01); *H01L 21/0277* (2013.01); *H01L 29/78* (2013.01); *H01L 21/28123* (2013.01); *H01L 21/28587* (2013.01); *H01L 29/42312* (2013.01); *H01L 29/2003* (2013.01)

(58) Field of Classification Search
CPC ............ H01L 21/0277; H01L 21/0274; H01L 21/0435; H01L 21/28114; H01L 21/28123; H01L 21/28537; H01L 29/66431; H01L 29/66462; H01L 29/778; H01L 29/78
USPC .................. 438/182, 172; 257/194, E29.246, 257/E21.403, E21.407, E21.03; 430/312
See application file for complete search history.

(56) References Cited

U.S. PATENT DOCUMENTS

| | | | | | |
|---|---|---|---|---|---|
| 4,959,326 | A | * | 9/1990 | Roman et al. | 438/574 |
| 5,300,445 | A | * | 4/1994 | Oku | 438/571 |
| 5,693,560 | A | * | 12/1997 | Hattori et al. | 257/473 |

(Continued)

OTHER PUBLICATIONS

Article "Elimination of King Effects in INaLaS/AlNGaAs Inp-Based HEMT'S by Means of INP Etch Stop Layer" Meneghesso et al., Oct. 1998, pp. 219-224.

(Continued)

*Primary Examiner* — Joseph C Nicely
(74) *Attorney, Agent, or Firm* — Tarolli, Sundheim, Covell & Tummino LLP

(57) ABSTRACT

A method is provided for forming a gate contact for a compound semiconductor device. The gate contact is formed from a gate contact portion and a top or wing contact portion. The method allows for the tunablity of the size of the wing contact portion, while retaining the size of the gate contact portion based on a desired operational frequency. This is accomplished by providing for one or more additional conductive material processes on the wing contact portion to increase the cross-sectional area of the wing contact portion reducing the gate resistance, while maintaing the length of the gate contact portion to maintain the operating frequency of the device.

16 Claims, 6 Drawing Sheets

(56) References Cited

U.S. PATENT DOCUMENTS

| | | | |
|---|---|---|---|
| 5,766,967 A * | 6/1998 | Lai et al. | 438/167 |
| 5,770,525 A * | 6/1998 | Kamiyama | 438/745 |
| 5,888,860 A * | 3/1999 | Kohno | 438/180 |
| 5,970,328 A * | 10/1999 | Park et al. | 438/176 |
| 6,051,454 A * | 4/2000 | Anda et al. | 438/167 |
| 6,294,446 B1 * | 9/2001 | Ishikawa | 438/579 |
| 6,387,783 B1 * | 5/2002 | Furukawa et al. | 438/574 |
| 6,586,319 B1 * | 7/2003 | Hirano | 438/574 |
| 6,717,271 B2 * | 4/2004 | Makiyama et al. | 257/773 |
| 7,445,975 B2 * | 11/2008 | Behammer | 438/182 |
| 7,608,497 B1 * | 10/2009 | Milosavljevic et al. | 438/182 |
| 7,892,903 B2 * | 2/2011 | Pellens | 438/182 |
| 7,897,446 B2 * | 3/2011 | Smorchkova et al. | 438/182 |
| 2003/0129818 A1 * | 7/2003 | Inai et al. | 438/595 |
| 2003/0207554 A1 * | 11/2003 | Makiyama et al. | 438/585 |
| 2004/0140506 A1 * | 7/2004 | Singh et al. | 257/367 |
| 2005/0186785 A1 * | 8/2005 | Pellens | 438/648 |
| 2005/0202613 A1 * | 9/2005 | Pellens et al. | 438/167 |
| 2007/0264763 A1 * | 11/2007 | Behammer | 438/172 |
| 2008/0064155 A1 * | 3/2008 | Baudet et al. | 438/197 |
| 2008/0182369 A1 * | 7/2008 | Jeong et al. | 438/172 |
| 2009/0081593 A1 * | 3/2009 | Kon et al. | 430/312 |
| 2009/0108299 A1 * | 4/2009 | Smorchkova et al. | 257/194 |
| 2009/0146184 A1 * | 6/2009 | Lim et al. | 257/192 |
| 2009/0159930 A1 * | 6/2009 | Smorchkova et al. | 257/194 |
| 2009/0206369 A1 * | 8/2009 | Dang et al. | 257/194 |
| 2009/0267116 A1 * | 10/2009 | Wu et al. | 257/194 |
| 2010/0102359 A1 * | 4/2010 | Khan et al. | 257/194 |
| 2010/0171150 A1 * | 7/2010 | Smith et al. | 257/194 |
| 2010/0184262 A1 * | 7/2010 | Smorchkova et al. | 438/172 |
| 2010/0276698 A1 * | 11/2010 | Moore et al. | 257/76 |
| 2011/0169054 A1 * | 7/2011 | Wu et al. | 257/194 |
| 2011/0180850 A1 * | 7/2011 | Shih et al. | 257/192 |
| 2012/0132959 A1 * | 5/2012 | Parikh et al. | 257/194 |
| 2012/0161146 A1 * | 6/2012 | Shim | 257/76 |
| 2012/0193795 A1 * | 8/2012 | Whetten et al. | 257/753 |
| 2013/0321087 A1 * | 12/2013 | Lender et al. | 330/296 |

OTHER PUBLICATIONS

Article "Novel Gate—Recess Process for the Reduction of Parasitic Phenomena Due to Side-Etching in INaIAs/INGaAs HEMTS", Suemitsu et al., Sep. 1997, pp. 426-427.

Article "Two-Layer Resist Structure for Electron-Beam Fabrication of a Submicrometer Gate Length GaAs Device" Kato et al, Apr. 1987, pp. 753-758.

Article "0.2 M T-Gate Inalas/Ingaas Modfet with FT-170 GHZ", Adesida et al, Apr. 1990, pp. 69-72.

* cited by examiner

METHOD OF FORMING A GATE CONTACT

TECHNICAL FIELD

The present invention relates to semiconductors, and more particularly to a method of forming a gate contact.

BACKGROUND

Group III-V semiconductor transistors, such as high electron mobility transistors (HEMTs), require smaller gate contact lengths (Lg) (less than 40 nm) and low gate contact resistance (Rg) for high frequency operation. However the smaller gate contact size normally associates with higher gate resistance (Rg) due to the smaller physical dimensions of gate contact length. Historically, fabrication of a T-shaped gate contact (T-gate contact) approach has been implemented in the industry for group III to V semiconductor transistors. The T-shaped gate contact employs a small gate contact portion and a larger top contact portion, referred to as a wing. The purpose of the larger top contact portion (wing) is to increase the cross sectional area of gate (to lower the Rg) while maintaining the smaller gate length (lower Lg). However, when the T-gate is scaled down to smaller gate contact sizes (less than or equal to 40 nm), the wing contact portion size scales down proportionally and has smaller dimensions.

Some techniques have been employed to form gate contacts with smaller gate contact portion size with larger wing contact portions. One of the techniques employed to form gate contacts with smaller gate contact portion sizes with larger wing contact portions involves using two separate exposure/development steps and two separate metalization steps. The gate contact is formed in the first resist exposure, development, and metallization processing step, and the wing contact portion in the second resist exposure, development, and metallization processing step. This process would allow the wing to be sized to many selective wing sizes. However the disadvantages are that the registration of the wing contact portion to the gate contact portion can be misaligned. Furthermore, the increased number of processing steps to achieve the results will lower the total gate yield when dealing with gate sizes of 40 nm or smaller. The number of processing steps will also effectively increase the length of processing time and cost.

Another technique is to use a two step resist exposure process of exposing and developing a resist of a wing contact portion first and then exposing and developing a resist of a gate contact portion. However there can be misalignment of wing contact portion to gate contact portion registration, and the gate size control/uniformity can degrade by wing dose contribution to the gate dose.

A third technique is to use multiple layers of resist, and use a set of developers. Each developer specifically develops each resist layer individually. This allows the wing size to be developed for longer time resulting in a larger wing. However, each of the resist layers needs to be developed completely, so that the next developer can develop the next layer correctly. Any resist not completely developed away will prevent the next developer from opening the resist for the next layer. Additionally, the different resists can form an inter-mixed layer which can be difficult to develop out completely by any of the developers.

SUMMARY

In accordance with an aspect of the invention, a method is provided for forming a gate contact for a compound semiconductor device. The method comprises depositing a first photoresist material layer over a substrate and depositing a second photoresist material layer over the first photoresist material layer. The second photoresist material layer has a higher sensitivity to a photoresist development process than the first photoresist material layer. The method further comprises performing a photoresist development process to form a first via in the first photoresist material layer and a second larger via, overlying the first via, in the second photoresist material layer, performing a first conductive material deposition process to form a gate contact having a gate contact portion formed in the first via in contact with the substrate and a wing contact portion disposed over and in contact with the gate contact portion in the second larger via, and stripping a conductive material layer that results from the first conductive material deposition process from the second photoresist material layer. The method also comprises performing etching process to remove additional portions of the second photoresist material layer from the second larger via to laterally extend the second larger via, and performing a second conductive material deposition process to form an outer wing contact portion to increase the cross-sectional area of the wing contact portion, while maintaining the length of the gate contact portion.

In another aspect of the invention, a method for forming a compound semiconductor device is provided. The method comprises depositing a first photoresist material layer over a substrate, and depositing a second photoresist material layer over the first photoresist material layer. The second photoresist material layer has a higher sensitivity to a photoresist development process than the first photoresist material layer. The method further comprises performing an electron beam lithography process to form a first via in the first photoresist material layer and a second larger via, overlying the first via, in the second photoresist material layer, depositing a first conductive material to form a gate contact having a gate contact portion formed in the first via in contact with the substrate and a wing contact portion located over and in contact with the gate contact portion in the second larger via, and stripping a conductive material layer that results from the depositing the first conductive material from the second photoresist material layer. The method further comprises performing an oxygen $O_2$ plasma process to remove additional portions of the second photoresist material layer from the second larger via to laterally extend the second larger via, and evaporating and depositing a second conductive material to form an outer wing contact portion to increase the cross-sectional area of the wing contact portion, while maintaining the length of the gate contact portion, wherein the length of the gate contact portion is selected to provide a desired operating frequency and the cross-sectional area of the wing contact portion is selected to provide a desired gate contact resistance without deleterious effects on the desired operating frequency.

In accordance with yet another aspect of the invention, a compound semiconductor device is provided that comprises a substrate and a gate contact having a gate contact portion in contact with the substrate and a wing contact portion disposed over and in contact with the gate contact portion. The wing contact portion has an inner wing contact portion and an outer wing portion, wherein the outer wing contact portion increases the cross-sectional area of the wing contact portion, while maintaining the length of the gate contact portion. The length of the gate contact portion is selected to provide a desired operating frequency and the cross-sectional area of the wing contact portion is selected to provide a desired gate contact resistance without deleterious effects on the desired operating frequency.

DETAILED DESCRIPTION

The present disclosure provides for a method of forming a gate contact for a compound semiconductor device, such as a high electron mobility transistor (HEMT). A compound semiconductor device includes two different atomic elements in each layer of the semiconductor device. For example, the semiconductor device can have semiconductor layers formed from Group III-V semiconductor materials, such as Gallium Nitride (GaN), Gallium Arsenide (GaAs), Indium Phosphide (InP) or other compound semiconductor. The gate contact is formed from a gate contact portion and a top or wing contact portion. The method allows for the tunablity of the size of the wing contact portion, while retaining the size of the gate contact portion based on a desired operational frequency. This is accomplished by providing for one or more additional conductive material processes on the wing contact portion to increase the cross-sectional area of the wing contact portion reducing the gate resistance, while maintaing the length of the gate contact portion to maintain the operating frequency of the device.

Figure 1:
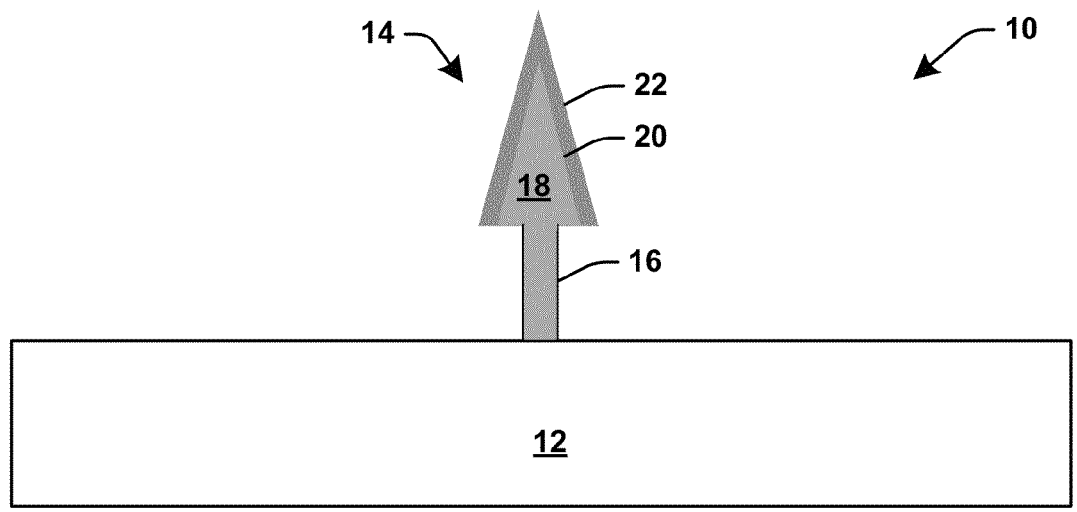
FIG. 1 illustrates a schematic cross-sectional view of a compound semiconductor structure in accordance with an aspect of the present invention.

FIG. 1 is a schematic cross-sectional illustration of a portion of a compound semiconductor structure 10 in accordance with the present invention. The compound semiconductor structure 10 includes a gate contact 14 that overlies a substrate 12. The substrate 12 can be a dielectric layer overlying a channel region (not shown) of a transistor. The transistor can be, for example, a high electron mobility transistor (HEMT) formed from various compound semiconductor material layers. The gate contact 14 has a generally pine tree shape or "T" shape to minimize resistance which provides high device operating performance. The gate contact 12 can be formed from one or more conductive materials, such as gold, aluminum, copper, platinum, or other conductive material layer.

The gate contact 12 is formed of a gate contact portion 16 that is in contact with the substrate 12 and a top or wing contact portion 18 in contact with and overlying the gate contact portion 16. The gate contact portion 16 has a length that is selected based on a desired operating frequency, while the wing contact portion 18 is selected to have a cross-sectional area that minimizes the resistance of the gate contact 14, which also contributes to high operating frequency. The wing contact portion 18 includes an inner wing contact portion 20 and an outer wing contact portion 22. The inner wing contact portion 20 and the outer contact portion 22 were formed from different conductive material deposition processes to increase the cross-sectional area of the wing contact portion 14 without increasing the length of the gate contact portion 16, as will be described below.

Figure 2:
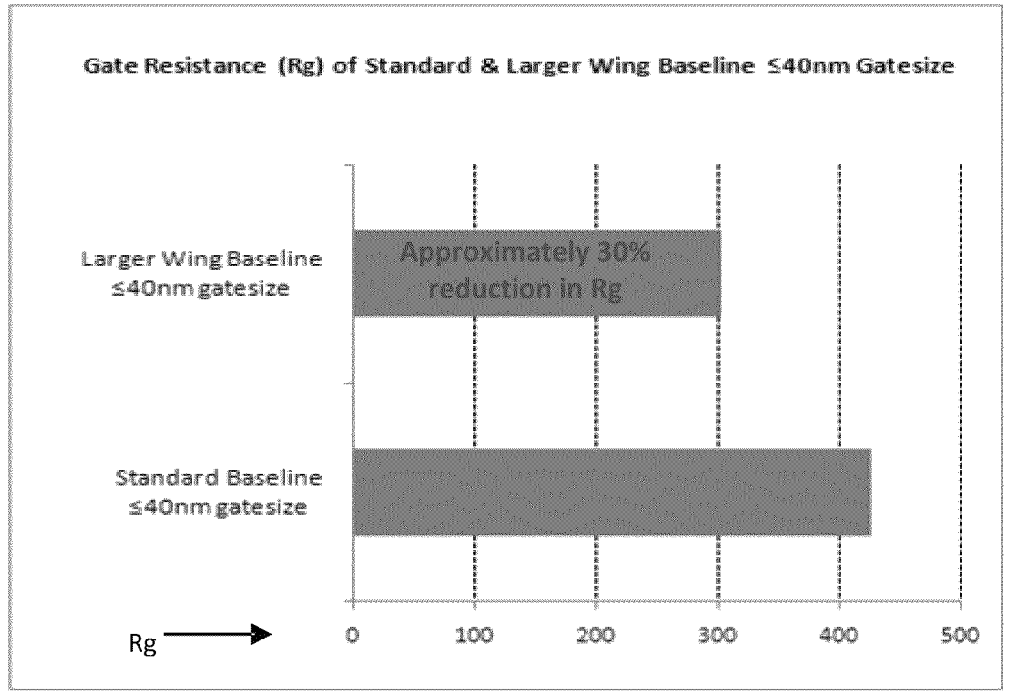
FIG. 2 is a chart of gate resistance for standard wing base line versus larger wing base line for gate sizes of 40 nm or less.

It is to be appreciated that when the gate contact is scaled down to smaller gate size (≤40 nm), the wing size scales down proportionally and has smaller dimensions. The wing size can decrease to as much as 30% of the original wing size when the gate size is in this range. By increasing the wing size using the disclosed methodology, the gate resistance can be reduced as shown in chart 30 of FIG. 2.

Turning now to FIGS. 3-13, process blocks in connection with fabrication of a portion of compound semiconductor structure (e.g., HEMT) in accordance with an aspect of the present invention are described. A first photoresist material layer 54 is deposited over a substrate 52 (e.g., compound semiconductor substrate, dielectric layer) and a second photoresist material layer 56 is deposited over the first photoresist material layer 54. The first photoresist material layer 54 and the second photoresist material layer 56 may be deposited using any suitable means. For example, the first photoresist material layer 54 may be deposited over the substrate 52 utilizing spin-coating or spin casting deposition techniques. Once the first photoresist material layer 54 dries, then the second photoresist material layer 56 may be deposited over the first photoresist material layer 54 utilizing spin-coating or spin casting deposition techniques. The second photoresist material layer 56 is selected to have a higher sensitivity to a photoresist development process than the first photoresist material layer 54, such that the second photoresist material layer 56 provides a larger via than the first photoresist material layer 54 upon completion of the photoresist development process.

Figure 3:
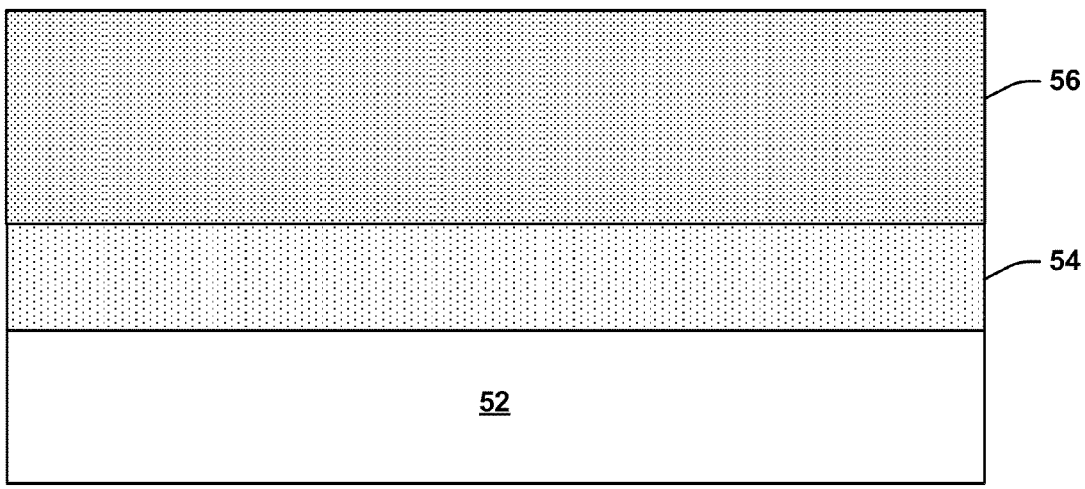
FIG. 3 is a schematic cross-sectional illustration of first and second photoresist material layers overlying a substrate for forming in accordance with an aspect of the present invention.
Figure 4:
FIG. 4 is a schematic cross-sectional illustration of the structure of FIG. 3 undergoing a photoresist development process in accordance with an aspect of the present invention.
Figure 4:
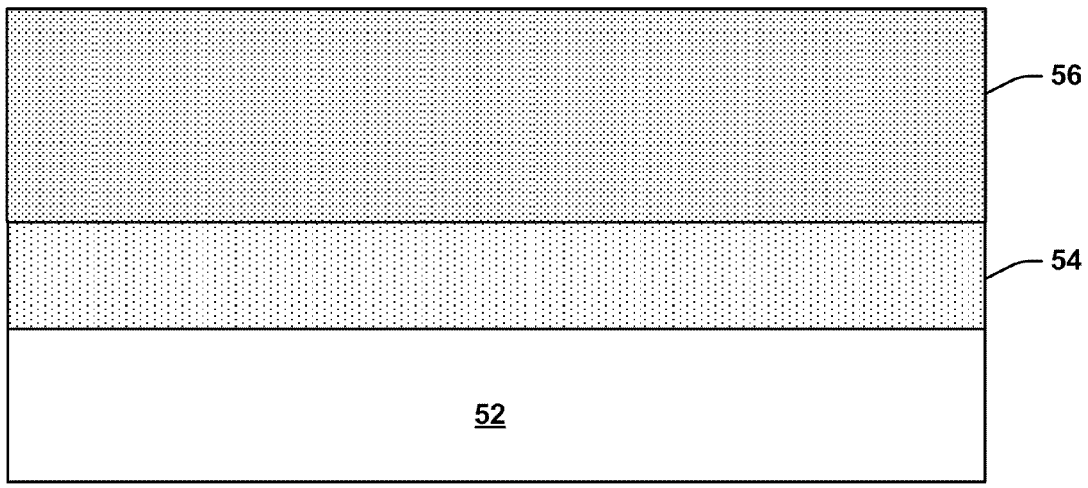
Figure 5:
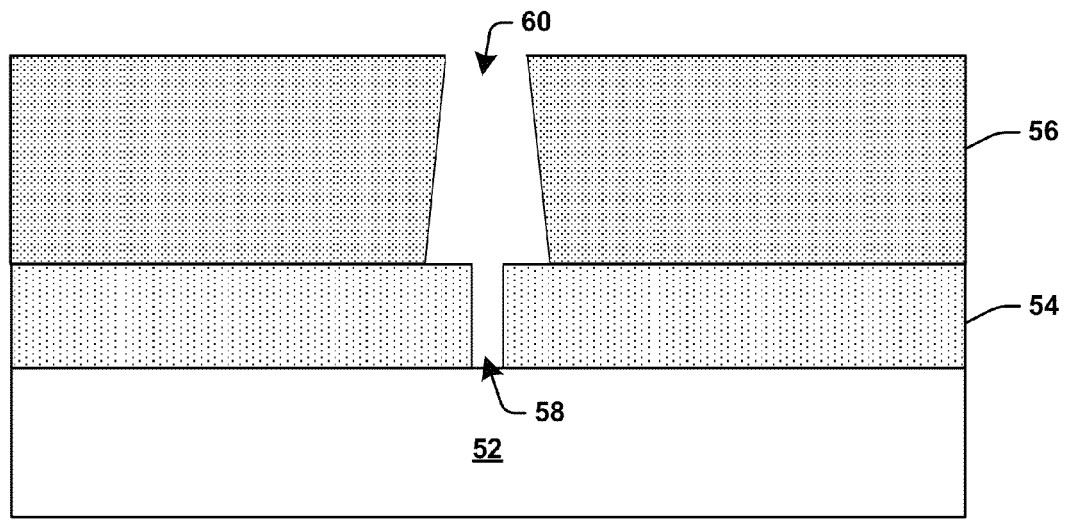
FIG. 5 is a schematic cross-sectional illustration of the structure of FIG. 4 after undergoing the photoresist development process in accordance with an aspect of the present invention.

FIG. 4 illustrates the structure of FIG. 3 undergoing a photoresist development process 100 in which an exposing source (such as optical light, x-rays, or an electron beam) illuminates selected areas of the first and second photoresist material layers 54 and 56 through an intervening mask, for a particular pattern, to become either more or less soluble (depending on the coating) in a particular solvent developer. Next, as represented in FIG. 5, solvent developer is applied to the exposed first and second photoresist material layers 54 and 56 to open a first via 58 in the first photoresist material layer 54 and a second larger via 60 in the second photoresist material layer 56 that overlies the first via 58. In one aspect of the invention, the photoresist development process employs electron beam lithography. However, any suitable photolithographic techniques can be performed to form the patterned first and second photoresist material layers 54 and 56.

Figure 6:
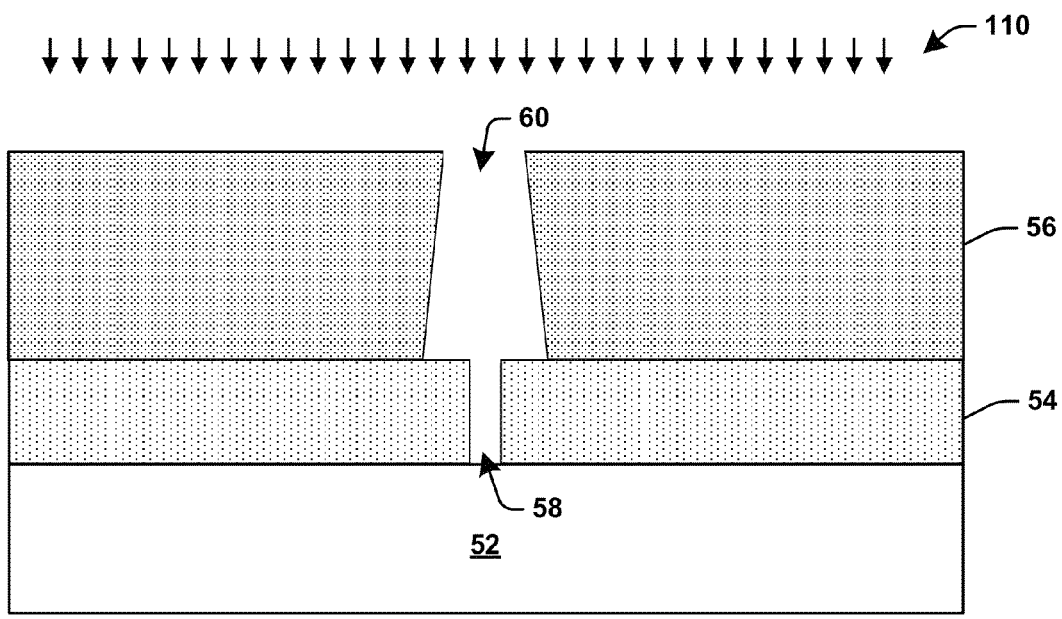
FIG. 6 is a schematic cross-sectional illustration of the structure of FIG. 5 undergoing a first conductive material deposition process in accordance with an aspect of the present invention.

FIG. 6 illustrates the structure of FIG. 5 undergoing a first conductive material deposition process 110. Any suitable technique for depositing the conductive material may be employed such as metal evaporation, sputter evaporation, plating, Low Pressure Chemical Vapor Deposition (LPCVD), Plasma Enhanced Chemical Vapor Deposition (PECVD), Atomic Layer Deposition (ALD), sputtering or spin on techniques. The conductive material can be one or more conductive materials and/or conductive material layers, such as gold, aluminum, copper, platinum, or other conductive materials.

Figure 7:
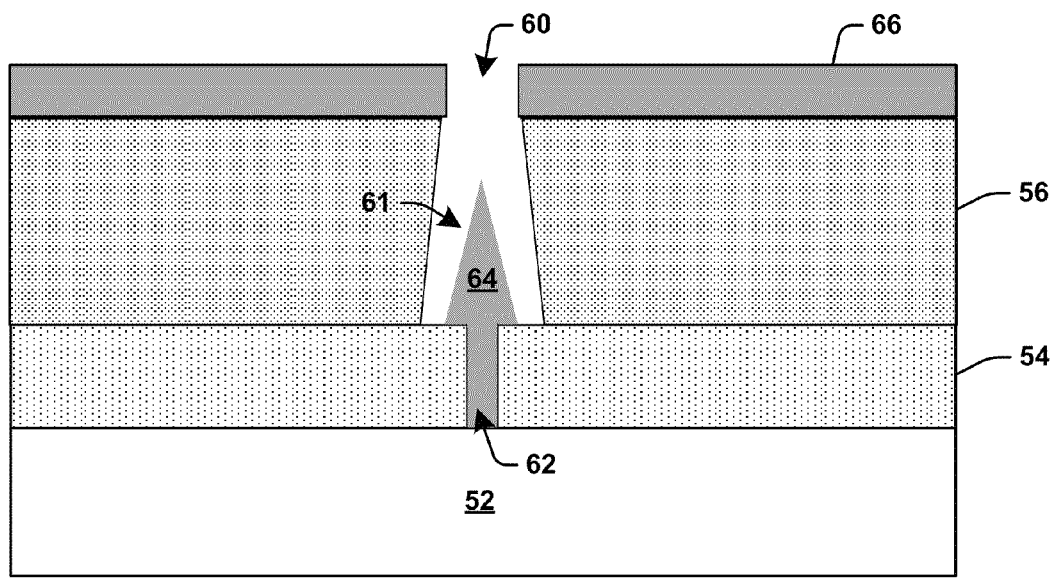
FIG. 7 is a schematic cross-sectional illustration of the structure of FIG. 6 after undergoing the first conductive material deposition process in accordance with an aspect of the present invention.

FIG. 7 illustrates the structure of FIG. 6 after the conductive material deposition process 110 in which a gate contact 61 has been formed. The gate contact 61 has a generally pine tree shape or "T" shape with a gate contact portion 62 that is in contact with the substrate 52 and a top or wing contact portion 64 overlying the gate contact portion 62. Additionally, a conductive material layer 66 has formed overlying the second photoresist material layer 56 as a result of the conductive material layer process 110. The conductive material layer 66 includes portions that overly the second larger via 60, which prohibits further forming of the cross-sectional area of the wing contact portion 64.

Figure 8:
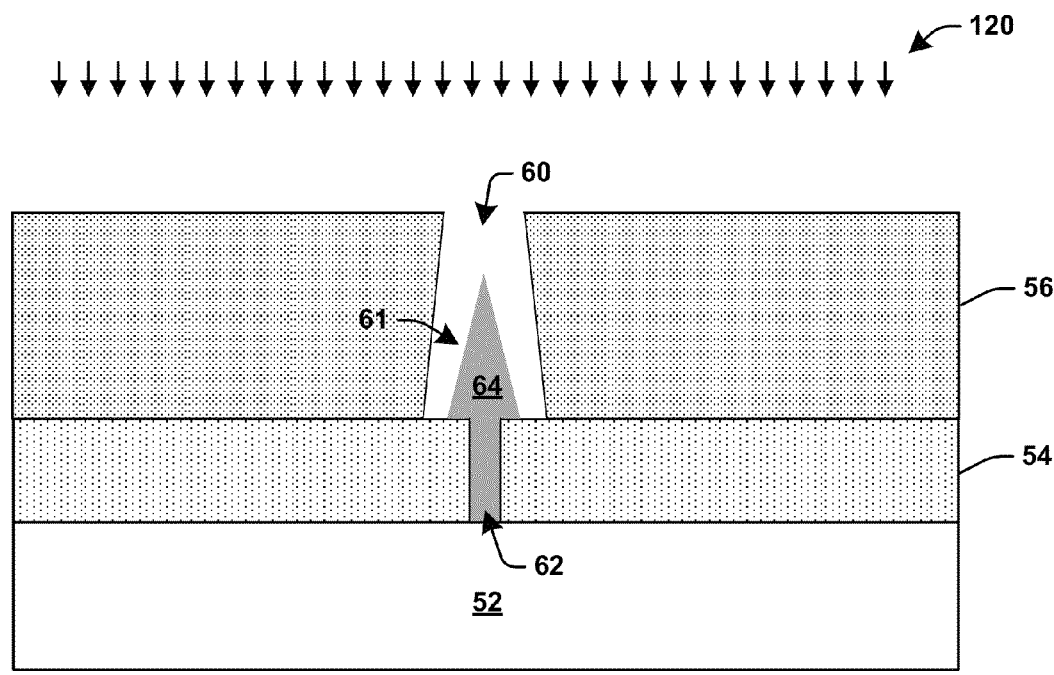
FIG. 8 is a schematic cross-sectional illustration of the structure of FIG. 7 undergoing an isotropic oxygen $O_2$ plasma process in accordance with an aspect of the present invention.

Next, the conductive material layer 66 is stripped from the second photoresist material layer 56 and the resultant structure is subjected to an isotropic oxygen $O_2$ plasma process 120, as illustrated in FIG. 8. The isotropic oxygen $O_2$ plasma process 120 removes additional portion of the second photoresist material layer 56 and laterally widens the second larger via 60. The amount of lateral widen depends on the length of time of the plasma process and/or the plasma rate. It is to be appreciated that other etching techniques could be employed to laterally widen the second larger via 60.

Figure 9:
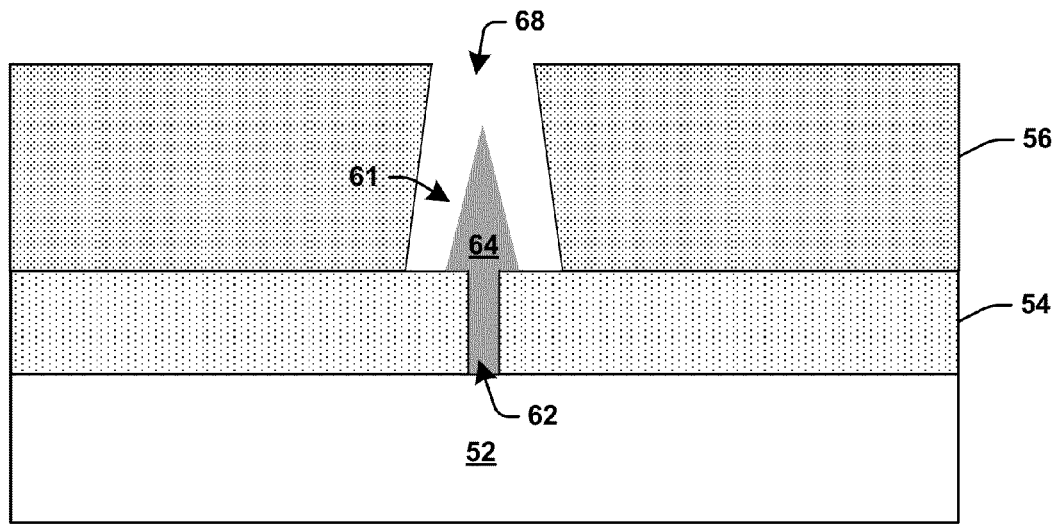
FIG. 9 is a schematic cross-sectional illustration of the structure of FIG. 8 after undergoing the isotropic oxygen $O_2$ plasma process in accordance with an aspect of the present invention.

It was discovered that the stripping of the conductive material layer 66 results in the top surface of the second photoresist material layer 56 becoming more resistant to the isotropic plasma process 120 than the photoresist material in the second larger via 60. Therefore, the photoresist material in the second larger via 60 etches at a faster rate than the top surface of the second photoresist material layer 56. FIG. 9 illustrates the resultant structure of FIG. 8 with a laterally extended second via 68.

Figure 10:
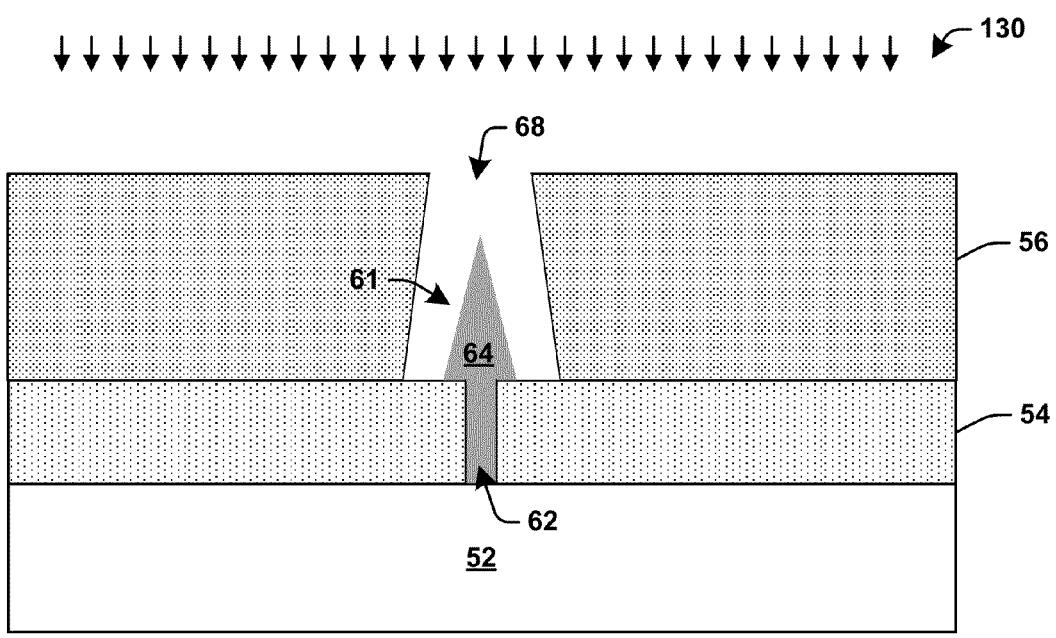
FIG. 10 is a schematic cross-sectional illustration of the structure of FIG. 9 undergoing a second conductive material deposition process in accordance with an aspect of the present invention.
Figure 11:
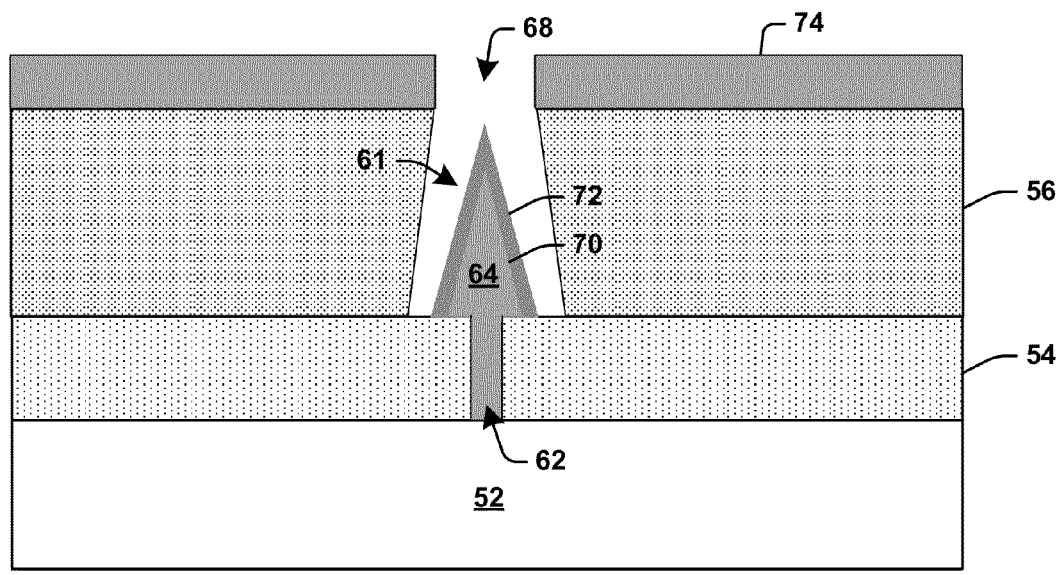
FIG. 11 is a schematic cross-sectional illustration of the structure of FIG. 10 after undergoing the second conductive material deposition process in accordance with an aspect of the present invention.
Figure 12:
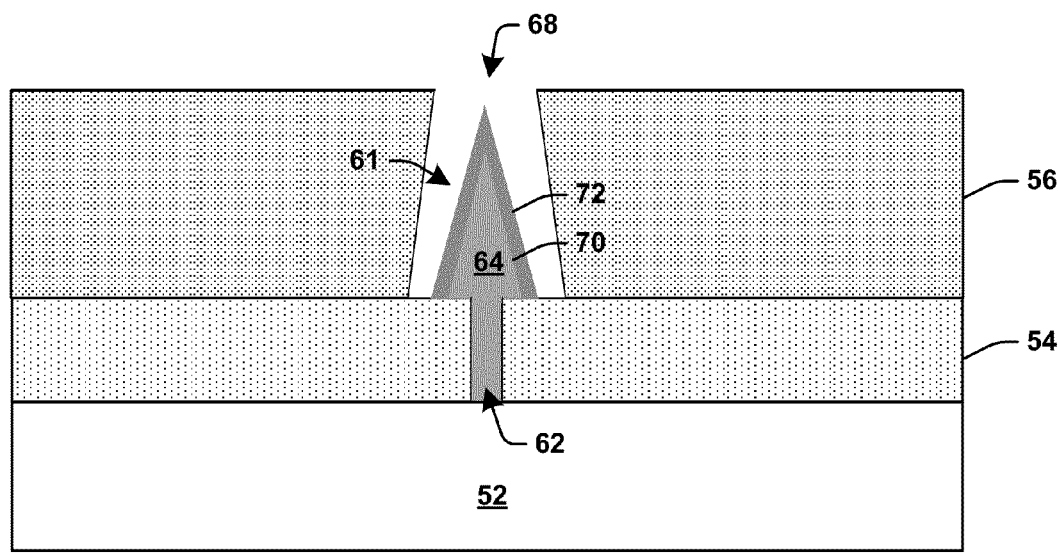
FIG. 12 is a schematic cross-sectional illustration of the structure of FIG. 11 after stripping of a conductive material layer from the second photoresist material layer in accordance with an aspect of the present invention.

FIG. 10 illustrates the structure of FIG. 9 undergoing a second conductive material deposition process 130. The second conductive material deposition process 130 can be a non-conformal conductive material deposition and employ a conductive material evaporator which deposits conductive material only on the top of the wing contact portion 64. The resultant structure is illustrated in FIG. 11, where an outer wing contact portion 72 is formed over the wing contact portion 64, which is now an inner wing contact portion. Again, a conductive material layer 74 has formed overlying the second photoresist material layer 56 as a result of the conductive material layer process 130. Next, the conductive material layer 74 is stripped from the second photoresist material layer 56 and the resultant structure is illustrated in FIG. 12.

The process can be repeated to form additional outer wing contact portions to increase the cross-sectional area of the wing contact portion 64 within practical limitations. The first and second photoresist material layers 54 and 56 illustrated in FIG. 12 can be stripped employing a wet chemical strip to provide the resultant structure illustrated in FIG. 1.

What has been described above includes exemplary implementations of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications, and variations.

What is claimed is:

1. A method for forming a gate contact for a compound semiconductor device, the method comprising:
    depositing a first photoresist material layer over a substrate;
    depositing a second photoresist material layer over the first photoresist material layer, the second photoresist material layer having a higher sensitivity to a photoresist development process than the first photoresist material layer;
    performing a photoresist development process to form a first via in the first photoresist material layer and a second larger via, overlying the first via, in the second photoresist material layer;
    performing a first conductive material deposition process to form a gate contact having a gate contact portion formed in the first via in contact with the substrate and a wing contact portion disposed over and in contact with the gate contact portion in the second larger via;
    stripping a conductive material layer that results from the first conductive material deposition process from the second photoresist material layer;
    performing an etch process, after the stripping of the conductive material, to remove additional portions of the second photoresist material layer from the second larger via to laterally extend the second larger via; and
    performing a second conductive material deposition process, after the performing of the etch process, to form an outer wing contact portion to increase the cross-sectional area of the wing contact portion, while maintaining the length of the gate contact portion.

2. The method of claim 1, wherein the photoresist development process employs electron beam lithography.

3. The method of claim 1, wherein the gate contact comprises one of or is formed from one or more layers of gold, aluminum, copper, platinum, titanium, and tungsten.

4. The method of claim of 1, wherein the substrate is a barrier layer of a transistor.

5. The method of claim 4, wherein the transistor is a high electron mobility transistor (HEMT).

6. The method of claim 1, wherein the gate contact has a general pine tree shape.

7. The method of claim 1, wherein performing a second conductive material deposition process comprises performing a non-conformal conductive material deposition process employing a conductive material evaporator.

8. The method of claim 1, further comprising stripping a conductive material layer that results from the second conductive material deposition process, and stripping the first and second photoresist material layers employing a wet chemical strip.

9. The method of claim 1, wherein the length of the gate contact portion is selected to provide a desired operating frequency and the cross-sectional area of the wing contact portion is selected to provide a desired gate contact resistance and to maintain the desired operating frequency.

10. The method of claim 1, further comprising repeating:
stripping a conductive material layer formed by the second conductive material deposition process, performing an oxygen $O_2$ plasma process after each of the stripping, and performing a third conductive material deposition process after the performing of the oxygen $O_2$ plasma process to form additional outer wing contact portion.

11. A method for forming a compound semiconductor device, the method comprising:
depositing a first photoresist material layer over a substrate;
depositing a second photoresist material layer over the first photoresist material layer, the second photoresist material layer having a higher sensitivity to a photoresist development process than the first photoresist material layer;
performing an electron beam lithography process to form a first via in the first photoresist material layer and a second larger via, overlying the first via, in the second photoresist material layer;
depositing a first conductive material to form a gate contact having a gate contact portion formed in the first via in contact with the substrate and a wing contact portion located over and in contact with the gate contact portion in the second larger via;
stripping a conductive material layer that results from the depositing the first conductive material from the second photoresist material layer;
performing an oxygen $O_2$ plasma process, after the stripping of the conductive material, to remove additional portions of the second photoresist material layer from the second larger via to laterally extend the second larger via; and
evaporating and depositing, after the performing of the oxygen $O_2$ plasma process, a second conductive material to form an outer wing contact portion to increase the cross-sectional area of the wing contact portion, while maintaining the length of the gate contact portion, wherein the length of the gate contact portion is selected to provide a desired operating frequency and the cross-sectional area of the wing contact portion is selected to provide a desired gate contact resistance and to maintain the desired operating frequency.

12. The method of claim 11, wherein the gate contact comprises one of or is formed from one or more layers of gold, aluminum, copper, and platinum.

13. The method of claim 11, wherein the compound semiconductor device is a high electron mobility transistor (HEMT) and the substrate is a barrier layer of the HEMT.

14. The method of claim 11, wherein the gate contact has a general pine tree shape.

15. The method of claim 11, further comprising stripping a conductive material layer that results from the second conductive material deposition process, and stripping the first and second photoresist material layers employing a wet chemical strip.

16. The method of claim 11, further comprising repeating: stripping a conductive material layer formed by the evaporating and depositing of the second conductive material, performing an additional oxygen $O_2$ plasma process after each of the stripping, and evaporating and depositing a third conductive material after the performing of the additional oxygen $O_2$ plasma process to form an additional outer wing contact portion.

* * * * *